(12) United States Patent
Chen

(10) Patent No.: US 7,210,519 B2
(45) Date of Patent: May 1, 2007

(54) HEAT PIPE

(75) Inventor: Ga-Lane Chen, Fremont, CA (US)

(73) Assignee: Hon Hai Precision Industry Co. Ltd, Taipei Hsien (TW)

( * ) Notice: Subject to any disclaimer, the term of this patent is extended or adjusted under 35 U.S.C. 154(b) by 0 days.

(21) Appl. No.: 11/198,032

(22) Filed: Aug. 5, 2005

(65) Prior Publication Data

US 2006/0051536 A1    Mar. 9, 2006

(30) Foreign Application Priority Data

Sep. 8, 2004    (CN)    ............ 2004 1 0051450

(51) Int. Cl.
*F28D 15/00*    (2006.01)
*H05K 7/20*    (2006.01)

(52) U.S. Cl. .............. 165/104.26; 165/104.21

(58) Field of Classification Search ........... 165/104.21, 165/104.26, 905, 133; 257/715; 174/15.2; 977/701, 962; 361/700
See application file for complete search history.

(56) References Cited

U.S. PATENT DOCUMENTS

| 3,598,177 | A | * | 8/1971 | Webster | ............. | 165/104.26 |
|---|---|---|---|---|---|---|
| 4,004,441 | A | | 1/1977 | Leszak | | |
| 4,274,479 | A | * | 6/1981 | Eastman | ............. | 165/104.26 |
| 5,076,352 | A | | 12/1991 | Rosenfeld et al. | | |
| 6,233,146 | B1 | * | 5/2001 | Gilchrist et al. | ............. | 361/687 |
| 6,478,997 | B2 | | 11/2002 | McCullough | | |
| 6,521,324 | B1 | * | 2/2003 | Debe et al. | ............. | 156/235 |
| 6,960,243 | B1 | * | 11/2005 | Smith et al. | ............. | 95/117 |
| 2002/0166335 | A1 | * | 11/2002 | Smith et al. | ............. | 62/480 |
| 2005/0011572 | A1 | * | 1/2005 | Belcher | ............. | 138/137 |
| 2005/0056808 | A1 | * | 3/2005 | Leu et al. | ............. | 252/71 |
| 2005/0238810 | A1 | * | 10/2005 | Scaringe et al. | ............. | 427/249.1 |
| 2006/0005951 | A1 | * | 1/2006 | Yeh et al. | ............. | 165/104.26 |

* cited by examiner

*Primary Examiner*—Tho Duong
(74) *Attorney, Agent, or Firm*—Jeffrey T. Knapp

(57) ABSTRACT

A heat pipe includes a metal tube, a layer of nano-particles and a working fluid. The metal tube has an inner surface defining at least two pores. Each of the pores has a diameter in the range from about 2 to about 50 nanometers. The layer of nano-particles is formed at least one of on the surfaces of the meso-pores and on the inner surface of the metal tube. The working fluid is in the metal tube.

13 Claims, 3 Drawing Sheets

HEAT PIPE

FIELD OF THE INVENTION

The present invention relates to a heat exchanger, and particularly to a heat pipe.

BACKGROUND OF THE INVENTION

One may imagine a simple device, as shown in FIG. 5 (prior art). A metal tube 12 is in vertical orientation. The metal tube 12 is filled with a small amount of working fluid. A heat sink 14 is mounted on an upper side of the metal tube 12. A heat source 16 is applied to the lower side of the metal tube 12. The working fluid will evaporate, while cooling the heat source 14. The vapor 18a will move up, and condense near the heat sink 14. From there, the working fluid 18b drips back to the lower side of the metal tube 12.

In this model heat pipe, the working fluid 18b simply drips back to the heat source 16. It is quite obvious that this design will only work in vertical orientation. To overcome this limitation, commercially available heat pipes do not rely on gravity alone to move the working fluid back to the heat source.

One of such heat pipes may include a mesh defining a number of pores. A decrease in size of the pores may promote the generation of a capillary force. The capillary force drives the working fluid to the heat source. However, such decrease is limited because each of the pores of commercially-available meshes has a diameter more than about 1 micrometer.

What is needed, therefore, is a heat pipe including pores, wherein each of the pores has a diameter less than 1 micrometer.

SUMMARY OF THE INVENTION

A heat pipe of the present invention, in one form thereof, may include a metal tube, a layer of nano-particles and a working fluid sealed in the metal tube. The metal tube may have a tube inner surface, the tube inner surface defining at least two meso-pores and a distance between the meso-pores. The metal tube may be made of copper, aluminum, iron or stainless steel. Each of the meso-pores may have a rectangular, V-shaped, U-shaped, curve or ladder-shaped profile. Each of the meso-pores may have a diameter and a depth. The meso-pore diameter may advantageously be in the range from about 2 to about 50 nanometers. The meso-pore depth may usefully be in the range from about 2 to about 50 nanometers. The distance between the meso-pores may advantageously be in the approximate range of 2 to 50 nanometers.

Preferably, the layer of nano-particles is coated on the meso-pore surfaces and on the tube inner surface. The layer of nano-particles may have a thickness in the range from about 1 nanometer to about 20 nanometers. The layer of nano-particles may be advantageously made of a material selected from the group consisting of silicon oxide and aluminum oxide.

A method of the present invention, in one form thereof, may be used to define the meso-pores within the tube inner surface and the distance between adjacent meso-pores. The method may include a process of transferring a pattern onto a metal sheet. The transfer process may include a step of forming a stamper including the pattern. The process may further include a step of printing the pattern of the stamper onto the metal plate. The pattern may be printed by a nano-imprinting technique or, alternatively, by a hot-embossing technique.

The nano-scale meso-pores on the inner surface of the metal tube are regularly arranged so that the meso-pore separation distance between adjacent the meso-pores is also in nano scale. Such meso-pores and the nano-particles provide a satisfied capillary force for driving the working fluid to a heat source. The capillary force diffuses the working fluid along the inner surface of the metal tube. The diffused working fluid uniformly cools the heat source.

The embodiments may have many advantages. For example, the meso-pores on the inner surface of the metal tube are regularly arranged. In this arrangement, the distance between the adjacent meso-pores is also in nano scale. Such meso-pores and the nano-particles provide a satisfied capillary force for driving the working fluid to a heat source. The capillary force diffuses the working fluid along the inner surface of the metal tube. This diffusion increases the contact area between the working fluid and the metal tube near the heat source. This area increase helps the working fluid to uniformly cool the heat source.

On the other hand, the layer of nano-particles and the meso-pores of the metal tube increase the surface area of the inner surface of the metal tube. This increase enhances the thermal conductivity of the heat pipe.

Moreover, the meso-pores, acting as a kind of capillary structure, are definable on the inner surface of the metal tube. The defined meso-pores serve as a part of the metal tube. Being a part of the metal tube prevents such capillary structure and the metal tube from being separated. Furthermore, the layer of nano-particles increases the capillary force.

Other advantages and novel features of the invention will become more apparent from the following detailed description when taken in conjunction with the accompanying drawings.

DETAILED DESCRIPTION OF PREFERRED EMBODIMENTS

Figure 3:
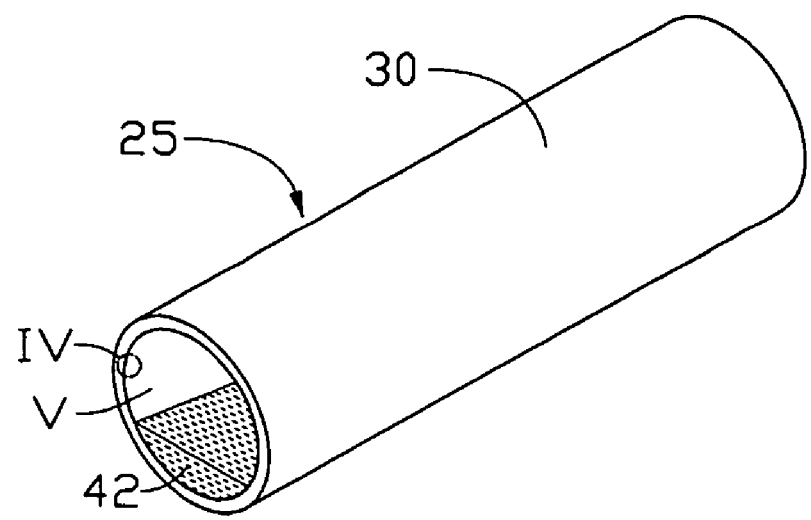
FIG. 3 schematically shows a metal tube of the first embodiment.
Figure 4:
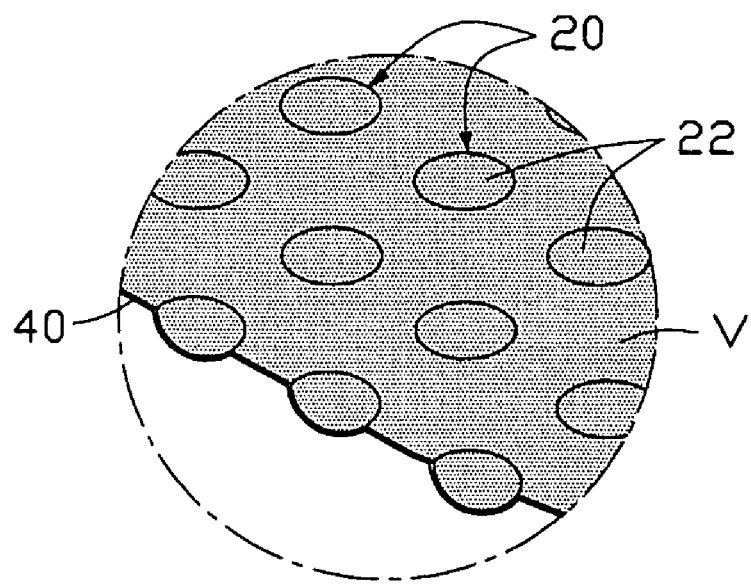
FIG. 4 shows a layer of nano-particles on the meso-pores of FIG. 2 and on the inner surface of the metal tube of FIG. 3.
Figure 5:
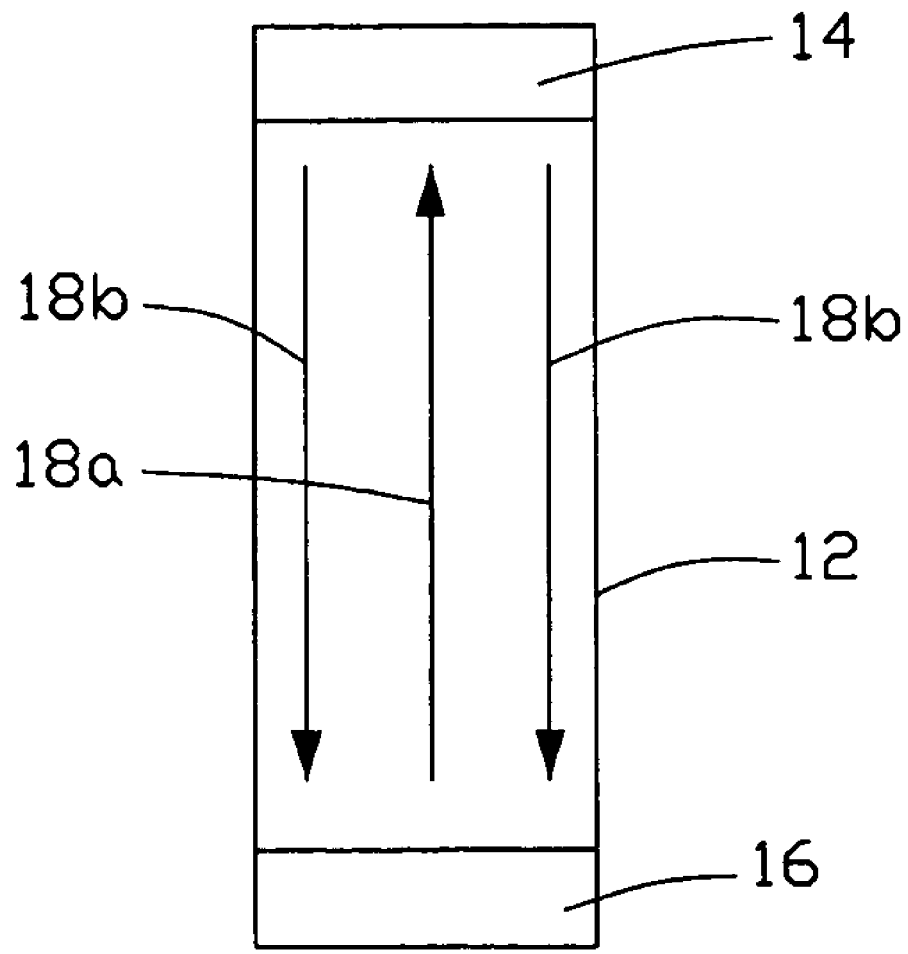
FIG. 5 is a schematic, cross-sectional view of a metal heat pipe of a prior art heat exchanger system.

A first embodiment provides a heat pipe 25 (FIGS. 3 and 4). The heat pipe 25 may include a metal tube 30, a layer of nano-particles 40 and a working fluid 42 in the metal tube 30. "Nano-", means $10^{(-9)}$ and is the next quantifier below "micro-". However, "nano-" may be used loosely to mean "small", e.g., nanotechnology.

Figure 2:
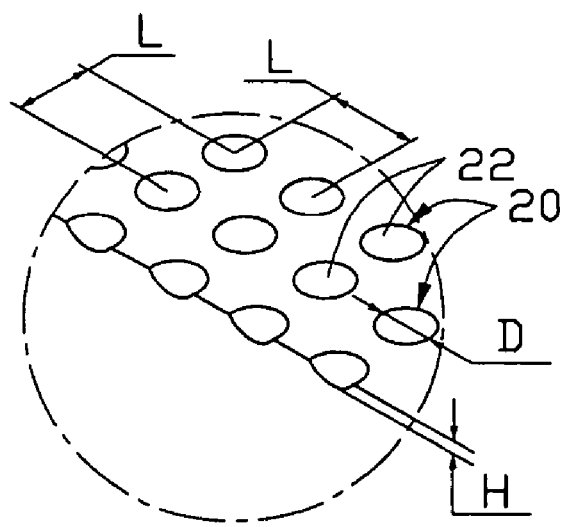
FIG. 2 is an enlarged, schematic view of an inner surface of the metal sheet of FIG. 1.

Referring to FIG. 3, the metal tube 30 is made advantageously of copper, aluminum, iron or stainless steel. The metal tube 30 may have a tube inner surface V defining at least two meso-pores 20, as shown in FIG. 2. "Meso-" is a prefix form denoting in the "intermediate" or "middle". Each of the meso-pores 20 may advantageously have a diameter D in the range from about 2 to about 50 nanometers, and preferably about 10 to about 40 nanometers. As seen from FIGS. 2 and 4, meso-pores 20 are open pores facing into the metal tube 30. Further, each meso-pore 20 has an associated meso-pore surface 22.

Referring also to FIG. 2, the tube inner surface V (FIG. 3) of the metal tube 30 may define a distance L between the meso-pores 20. The distance L between the meso-pores 20 is preferably in the range from about 2 to about 50 nanometers. Each of the meso-pores 20 may have a rectangular, V-shaped, U-shaped, curve or step-shaped profile (of which only U-shaped shown) in view of a cross section of the metal tube 30 (FIG. 3). Each of the meso-pores 20 may have a depth H in the range from about 2 to about 50 nanometers.

Referring to FIG. 4, the layer of nano-particles 40 may usefully have a thickness in the approximate range from about 1 nanometer to about 20 nanometers, and preferably about 2 to about 10 nanometers. The layer of nano-particles 40 may advantageously be made of a material selected from the group consisting of $SiO_2$ and $Al_2O_3$, although it is to be understood that any corrosion-resistant ceramic material could potentially be employed. The layer of nano-particles 40 may be coated on the meso-pore surfaces 22 (FIG. 2) and/or on the tube inner surface V (FIG. 3). The coating step is performed by, for example, depositing the layer of nano-particles 40. Such deposition may be achieved by a sputtering technique or an evaporation technique.

Figure 1:
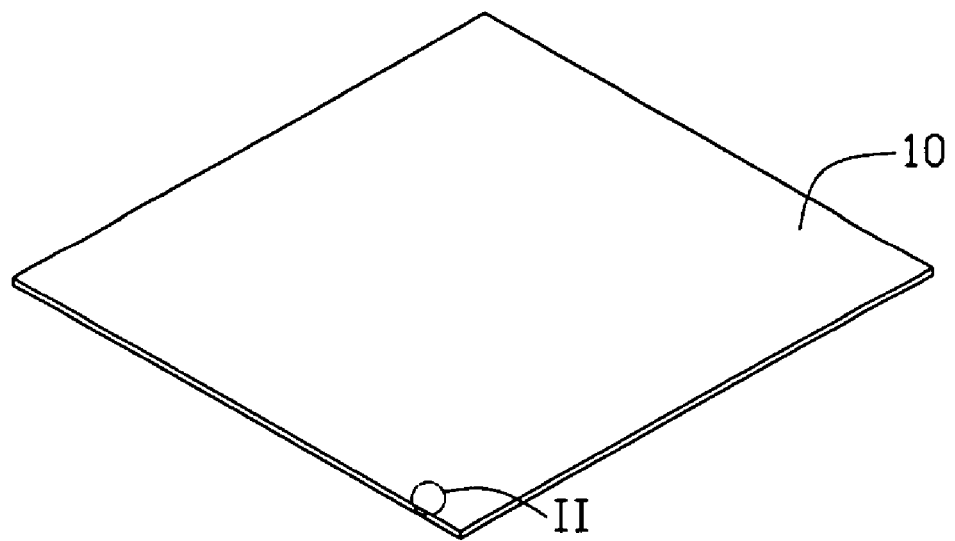
FIG. 1 is a schematic view of a metal sheet for forming a metal tube of a first embodiment of the present invention.

A second embodiment provides a method of defining the meso-pores 20 (FIG. 2) and the distance L associated with the tube inner surface V of the first embodiment. Referring to FIG. 1, the method may include a step of transferring a pattern onto a metal sheet 10. The metal sheet 10 may advantageously be made of copper, aluminum, iron, stainless steel, or another metal or alloy deemed to be sufficiently heat conductive and corrosion resistant. The pattern may, for example, be transferred by the reactive ion etch technique and the lithography technique, used in combination.

The pattern may be transferred onto the metal sheet 10 by a process. The process may include a step of forming a stamper by a combination of the reactive ion etch technique and the lithography technique. The stamper is formed to have the desired meso-pore pattern.

The stamper may be formed as follows (not illustrated). A pattern is designed. The designed pattern corresponds to a pattern of a meso-pores of the first embodiment. A silicon substrate is provided. A photoresist layer is coated on the silicon substrate. The coated photoresist layer serves as a mask on the silicon substrate. The mask is exposed and developed by the lithography technique of the second embodiment. The mask is then partially removed, thereby partially exposing the silicon substrate. The exposed silicon substrate has the designed pattern. A gold film is formed on the exposed silicon substrate. Such a formed gold film has the designed pattern serving as the pattern of a V-shaped groove of the second embodiment. A layer of nickel is electroformed over the gold film and the silicon substrate. The silicon substrate is removed by being immersing with a base solution of potassium hydroxide. The mask is removed by the reactive-ion-etch technique of the second embodiment. After a such removing step, the layer of nickel and the gold film collectively serve as the stamper.

Referring to FIG. 1 to FIG. 3, the metal sheet 10 having the pattern of meso-pores 20 formed therein (FIG. 2) is molded to form a metal tube 30 (FIG. 3). The formed metal tube 30 thus includes the meso-pores 20 in the tube inner surface V. The molding method includes a step of rolling up and sealing the metal sheet 10 into a tubular configuration.

Referring to FIG. 3, the metal tube 30 surrounds an amount of air. The air is drawn out, thereby evacuating the metal tube 30. A suitable amount of working fluid 42 is then added into in the metal tube 30. The working fluid 42 may usefully be comprised of a fluid selected from the group consisting of pure water, ammonia water, methanol, acetone and heptane. Alternatively, working fluid 42 may potentially be another type of fluid capable of undergoing a liquid/gas transformation near room temperature.

A number of particles may usefully be included in the working fluid 42. The particles may be made of a conductive material, for increasing the thermal conductivity of the working fluid. Such particles may be, for example, suspended in the working fluid 42. The suspended particles may advantageously be carbon nanotubes, carbon nanocapsules, copper nano-particles and/or another metallic nano-material. The carbon nanotubes, if chosen, may be filled with copper nano-particles.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat pipe comprising:
a metal tube having an inner surface defining at least two meso-pores and a distance between the meso-pores, the metal tube being comprised of copper, aluminum, iron or stainless steel, each of the meso-pores having a diameter and a depth, the diameter being in the range from about 2 to about 50 nanometers, the depth being in the range from about 2 to about 50 nanometers, the distance between the meso-pores being in the range from about 2 to about 50 nanometers, each of the meso-pores having a meso-pore surface associated therewith, each meso-pore surface being formed in the inner surface of the metal tube;
a layer of nano-particles coated on at least one of each meso-pore surface and the inner surface of the metal tube, the layer of nano-particles having a thickness in the range from about 1 nanometer to about 20 nanometers, the layer of nano-particles being comprised of a material selected from the group consisting of silicon dioxide and aluminum oxide; and
a working fluid, sealed in the metal tube, the working fluid being comprised of a fluid selected from the group consisting of pure water, ammonia water, methanol, acetone and heptane, the working fluid further comprising a plurality of conductive nano-particles selected from the group consisting of copper nano-particles, nanotubes and nanocapsules.

2. A heat pipe comprising:
a metal tube itself defining an inner surface, the metal tube further defining at least two pores on the inner surface thereof, each of the pores having a diameter in the range from about 2 to about 50 nanometers; and
a working fluid in the metal tube;
wherein each pore has a yore surface associated therewith the heat pipe further comprising a layer of nano-particles formed on at least one of the pore sw-faces of the pores and the inner surface of the metal tube, the layer of nano-particles being comprised of a material selected from the group consisting of silicon dioxide and aluminum oxide.

3. The heat pipe of claim 2, wherein a distance exists between any adjacent pair of the pores, the distance between any adjacent pair of the pores being in the range from about 2 to about 50 nanometers.

4. The heat pipe of claim 2, wherein the metal tube is comprised of at least one of copper, aluminum, iron and stainless steel.

5. The heat pipe of claim 2, wherein the layer of nano-particles has a thickness in the range from about 1 nanometer to about 20 nanometers.

6. The heat pipe of claim 2, wherein the working fluid is comprised of a fluid selected from the group consisting of pure water, ammonia water, methanol, acetone and heptane.

7. The heat pipe of claim 2, wherein each of the pores has a diameter in the range from about 10 to about 40 nanometers.

8. A heat pipe comprising:
   a metal tube itself defining an inner surface, the metal tube further defining at least two pores on the inner surface thereof, each of the pores having an associated pore surface, each of the pores further having a diameter in the range from about 2 to about 50 nanometers;
   a layer of nano-particles formed on at least one of the surfaces of the pores and the inner surface of the metal tube; and
   a working fluid in the metal tube;
   wherein the nano-narticles are comprised of a material selected from the group consisting of silicon dioxide and aluminum oxide.

9. The heat pipe of claim 8, wherein each of the pores has a diameter in the range from about 10 to about 40 nanometers.

10. The heat pipe of claim 8, wherein a distance exists between any adjacent pair of the pores, the distance between any adjacent pair of the pores being in the range from about 2 to about 50 nanometers.

11. The heat pipe of claim 8, wherein each of the pores has a depth in the range from about 2 to about 50 nanometers.

12. The heat pipe of claim 8, wherein the layer of nano-particles has a thickness in the range from about 1 nanometer to about 20 nanometers.

13. The heat pipe of claim 2, each of the pores having a depth in the range from about 2 to about 50 nanometers.

* * * * *